(12) United States Patent
Takahashi et al.

(10) Patent No.: US 7,852,704 B2
(45) Date of Patent: Dec. 14, 2010

(54) SEMICONDUCTOR STORAGE DEVICE

(75) Inventors: Hiroyuki Takahashi, Kanagawa (JP); Atsushi Nakagawa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 224 days.

(21) Appl. No.: 12/232,159

(22) Filed: Sep. 11, 2008

(65) Prior Publication Data

US 2009/0073744 A1    Mar. 19, 2009

(30) Foreign Application Priority Data

Sep. 13, 2007    (JP) .............................. 2007-237881

(51) Int. Cl.
  *G11C 8/00*    (2006.01)
(52) U.S. Cl. .................................. 365/230.06; 365/226
(58) Field of Classification Search ............ 365/230.06, 365/226, 149
  See application file for complete search history.

(56) References Cited

U.S. PATENT DOCUMENTS 6,198,685 B1 * 3/2001 Sudo et al. ............. 365/230.06
6,335,893 B1 * 1/2002 Tanaka et al. ............... 365/226
6,781,915 B2 * 8/2004 Arimoto et al. ......... 365/230.03
2002/0024873 A1 * 2/2002 Tomishima et al. ..... 365/230.06

FOREIGN PATENT DOCUMENTS

JP    11-31384    2/1999
JP    2005-135461    5/2005

* cited by examiner

*Primary Examiner*—Anh Phung
(74) *Attorney, Agent, or Firm*—McGinn IP Law Group, PLLC

(57) ABSTRACT

A semiconductor storage device according to one aspect of the present invention includes a DRAM cell including one transistor and one capacitor, in which one of a first voltage and a second voltage is applied to a gate of the transistor, the first voltage being a selected voltage, and the second voltage being a non-selected voltage, a voltage difference between the first voltage and the second voltage is larger than a voltage difference between a power supply voltage and a ground voltage, and one of the ground voltage and the power supply voltage which is closer to the non-selected voltage is applied to a back gate of the transistor irrespective of selection or non-selection.

12 Claims, 10 Drawing Sheets

|  | WORD LINE VOLTAGE | | MEMORY CELL BACK GATE BIAS VOLTAGE |
| --- | --- | --- | --- |
|  | SELECTION STATE | NON-SELECTION STATE |  |
| RELATED ART(1) | VPP | GND | VBB |
| RELATED ART(2) | VPP | VKK | VBB (VALUE OF VBB IS SMALLER THAN THAT IN (1)) |
| PRESENT INVENTION | VPP | VKK | GND |

Fig. 5

SEMICONDUCTOR STORAGE DEVICE

BACKGROUND OF THE INVENTION

1. Field of the Invention

The present invention relates to a semiconductor storage device, and more specifically, to a DRAM (Dynamic Random Access Memory).

2. Description of Related Art

A DRAM includes complementary bit lines arranged in perpendicular to word lines, and memory cells arranged in intersections of the word lines and the complementary bit lines in matrix form.

FIG. 6 shows one example of a circuit configuration of a DRAM according to a related art. As shown in FIG. 6, a related memory 600 includes a word decoder 601 and a memory cell array 602. The word decoder 601 includes a word driver 610 driving a word line for selecting any memory cell. The memory cell array 602 includes memory cells 621, 622, and 623 connected to the word driver 610.

The word driver 610 includes inverters In611, In612, and In613 driven by a high-potential side word line driving voltage VPP and a ground voltage GND.

As shown in FIG. 7, each of the inverters In611, In612, and In613 includes a PMOS transistor P1 and an NMOS transistor N1 connected in series between the high-potential side word line driving voltage VPP and the ground voltage GND. Then a control signal CTRL is input to gates of the PMOS transistor P1 and the NMOS transistor N1. A drain of the PMOS transistor P1 and a drain of the NMOS transistor N1 are connected to each other, and each of the word lines WL1, WL2, and WL3 is connected to the node. For example, in writing or reading information according to the control signal CTRL, the inverter In611 of the word driver 610 outputs the high-potential side word line driving voltage VPP to the word line WL1. On the other hand, in holding the information, the inverter In611 of the word driver 610 outputs the ground voltage GND to the word line WL1. The high-potential side word line driving voltage VPP is higher than a power supply voltage VDD. The inverters In612 and In613 also have the same configuration as that of the inverter In611.

The memory cells 621, 622, and 623 include NMOS gate transistors Tr1, Tr2, and Tr3 and capacitors C1, C2, and C3, respectively. For example, a gate of the gate transistor Tr1 is connected to the word line WL1, and one of a drain and a source is connected to a bit line BLT. The other of the drain and the source of the gate transistor Tr1 is connected to a reference voltage HVDD (VDD/2) through the capacitor C1. The memory cells 622 and 623 also have the same configuration as that of the memory cell 621.

Back gates of the gate transistors Tr1, Tr2, and Tr3, which are wells in which the NMOS transistors are formed, are connected to a back gate voltage source 670. Note that an output voltage VBB (hereinafter referred to as VBB) of the back gate voltage source 670 is set to a negative voltage which is lower than the ground voltage GND. This is because it is possible to suppress an individual difference of a transistor threshold value due to the process variation in the DRAM or to enlarge a depletion layer between an n region of the drain or source and a p region of the well of the gate transistor so as to decrease the parasitic capacity between the p region and the n region by setting VBB to the negative voltage. Accordingly, it is generally appreciated and is almost regarded as common knowledge that VBB is set to the negative voltage which is lower than the ground voltage GND in a circuit configuration of a memory such as the DRAM.

The memory cell 621 sets the gate transistor Tr1 to a conduction state based on the voltage of the word line WL1 so as to write/read out information. Otherwise, the memory cell 621 sets the gate transistor Tr1 to a non-conduction state so as to hold charge stored in the capacitor C1. Further, the bit line BLT is connected to a sense amplifier 630. The bit line BLT is connected to the capacitor C1 when the gate transistor Tr1 is in the conduction state, and the charge information of the capacitor C1 is input to the sense amplifier 630 through the bit line BLT. The memory cells 622 and 623 also have the same configuration as well.

In a recent semiconductor storage device such as the DRAM, the manufacturing process has been miniaturized. There is a problem caused by the miniaturization of the manufacturing process that an off-state leak current of the transistor forming the DRAM increases. As the off-state leak current increases, the charge held in the capacitor of the memory cell readily decreases. Therefore, it is needed to frequently perform refresh operation on the DRAM which needs the refresh operation for holding the stored information. Accordingly, there is a problem that the power consumption of the DRAM increases. In order to solve this problem, a negative word line method has been used for the purpose of suppressing the leak current of the memory cell. In the negative word line method, the potential of the word line corresponding to the non-selected memory cell is set to the negative voltage VKK which is lower than the ground potential GND.

FIG. 8 shows one example of a circuit configuration of the negative word line method in which the voltage of the word line corresponding to the non-selected memory cell is set to the negative voltage VKK. As will be seen from FIG. 8, an output voltage of a low-potential side word line driving voltage source 860 (hereinafter referred to as VKK) is employed as a low-voltage side power supply voltage of the inverter included in the word driver 610. Therefore, the potential of the word line in a memory cell non-selection state is the negative voltage VKK which is lower than the ground potential GND. On the other hand, the driving voltage VPP is employed as the potential of the word line in a memory cell selection state. Japanese Unexamined Patent Application Publication Nos. 2005-135461 (related art (1)) and 11-031384 (related art (2)) disclose a technique of applying the negative voltage VBB to the back gate of the gate transistor of the memory cell and applying the negative voltage VKK to the non-selected word line.

However, in order to perform writing to/reading from the memory cells 621, 622, and 623, the logic level of the word lines (WL1, WL2, WL3) alternately repeats H level (VPP) and L level (VKK) at a certain cycle. This means that charging and discharging are repeated at a certain cycle in each word line. Accordingly, the low-potential side word line driving voltage source 860 needs to repeatedly execute absorption of the charge stored in the word line and supplying the negative voltage VKK to the plurality of inverters forming the word driver 610 for each cycle. It is needed to enhance the ability of the low-potential side word line driving voltage source 860. If the enhancement is insufficient, the output of the negative voltage of the low-potential side word line driving voltage source 860 gradually increases in a direction of the positive voltage and becomes unstable as shown in FIG. 9. The low-potential side word line driving voltage source 860 is connected to all the word lines corresponding to the non-selected memory cells as shown in FIG. 8. Therefore, the unstable voltage shown in FIG. 9 is transmitted to all the word lines corresponding to the non-selected memory cells, which makes it impossible to control the off-state leak current of the gate transistor.

As will be seen from the configuration of the gate transistor shown in FIG. 10, each word line is capacity-coupled with a well of the gate transistor of the memory cell through a gate capacitor Cg. In other words, the gate and the well of the gate transistor of the large number of non-selected memory cells in the DRAM chip, which are the low-potential side word line driving voltage source 860 and the back gate voltage source 670, are capacity-coupled through the gate capacitor Cg. Therefore, the unstable voltage output from the low-potential side word line driving voltage source 860 shown in FIG. 9 is transmitted to the back gate voltage source 670 as a noise. Due to the influence of this noise, the voltage VBB output from the back gate voltage source 670 increases or decreases from a predetermined voltage. Further, the potential of the cell node is also suffered from an adverse effect. More specifically, if the writing operation is performed on the memory cell in a state where VBB increases and the reading operation or the refresh operation is performed on the memory cell in a state where VBB decreases, the charge amount decreases compared with a case in which VBB is in the stable condition with a predetermined voltage value. Accordingly, the memory cell stated above results in hold defect. Furthermore, it is extremely difficult to reproduce the above worst condition and to reject the memory cell as a defective cell in a separating process or the like.

In order to overcome this problem, it may be effective to increase response speed of the low-potential side word line driving voltage source 860 or a volume of stabilizing capacitance for removing ripple. However, in order to increase the response speed of the low-potential side word line driving voltage source 860, the response of a voltage determination circuit of a negative charge pump 861 generating the negative voltage needs to be increased, which increases the power consumption of the amplifier in the determination circuit. Further, in order to increase the volume of stabilizing capacitance for removing the ripple, an area of a decoupling capacitor needs to be increased. Therefore, the power consumption or the area of the DRAM chip increases, which causes an adverse effect.

As stated above, according to the related semiconductor storage device, the output of the driving voltage source driving the word lines to the non-selected memory cells can be unstable.

SUMMARY

A semiconductor storage device according to one aspect of the present invention includes a DRAM cell including one transistor and one capacitor, in which one of a first voltage and a second voltage is applied to a gate of the transistor, the first voltage being a selected voltage, and the second voltage being a non-selected voltage, a voltage difference between the first voltage and the second voltage is larger than a voltage difference between a power supply voltage and a ground voltage, and one of the ground voltage and the power supply voltage which is closer to the non-selected voltage is applied to a back gate of the transistor irrespective of selection or non-selection.

According to the semiconductor storage device of the present invention, all the gate capacitors of the non-selected memory cell transistors perform the same function as that of the stabilizing capacitor of the power source applying the potential to the word lines. Accordingly, in the semiconductor storage device according to the present invention, the output of the driving voltage source driving the word line to the non-selected memory cell can be made stable without adding further circuits.

BRIEF DESCRIPTION OF THE DRAWINGS

The above and other objects and advantages and features of the present invention will be more apparent from the following description of certain preferred embodiments taken in conjunction with the accompanying drawings, in which:

FIG. 5 shows one example of a table showing a technical difference between related arts and the present invention;

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiment

Figure 1:
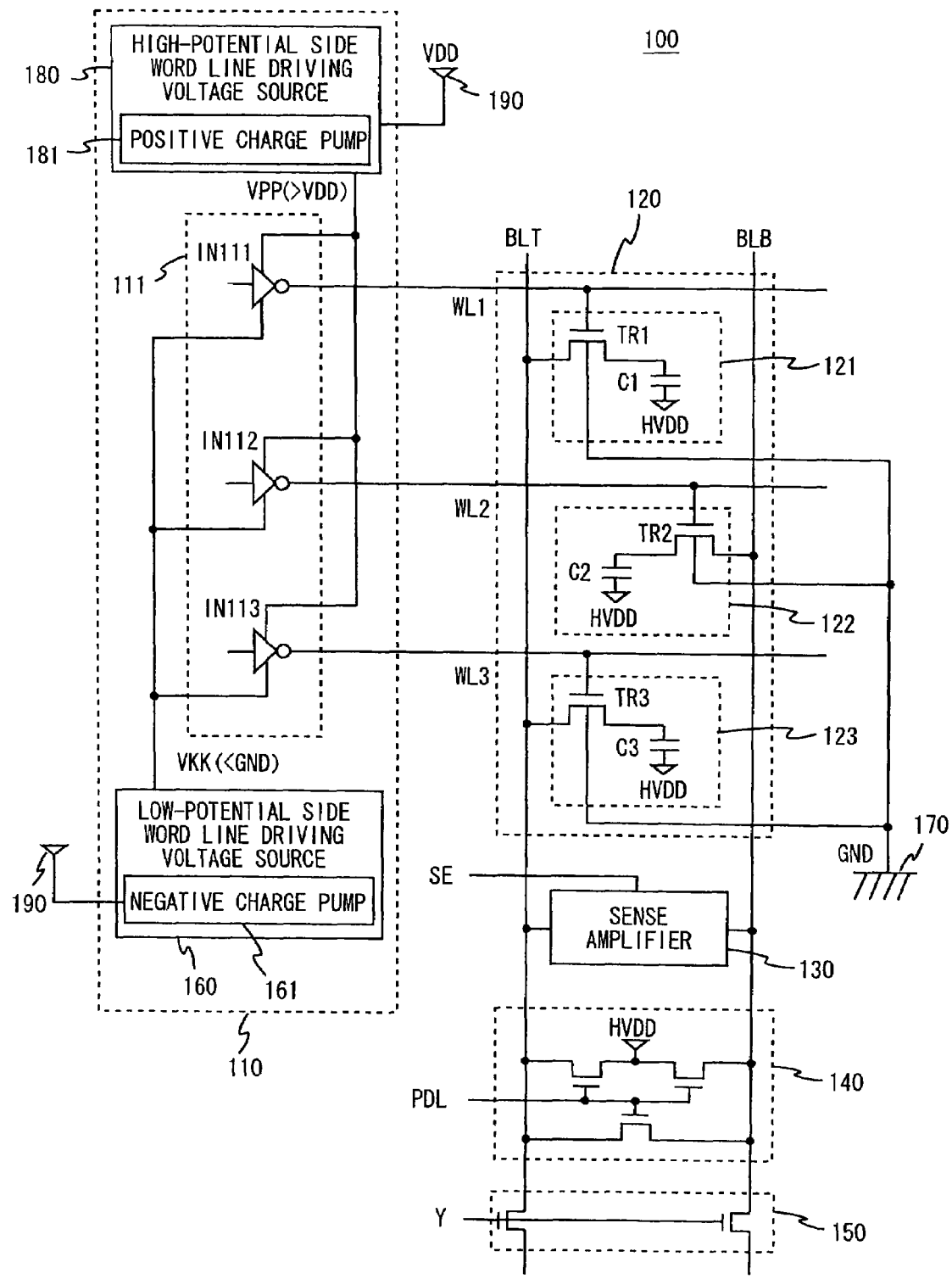
FIG. 1 shows one example of a circuit configuration of a semiconductor storage device according to an embodiment.
Figure 2:
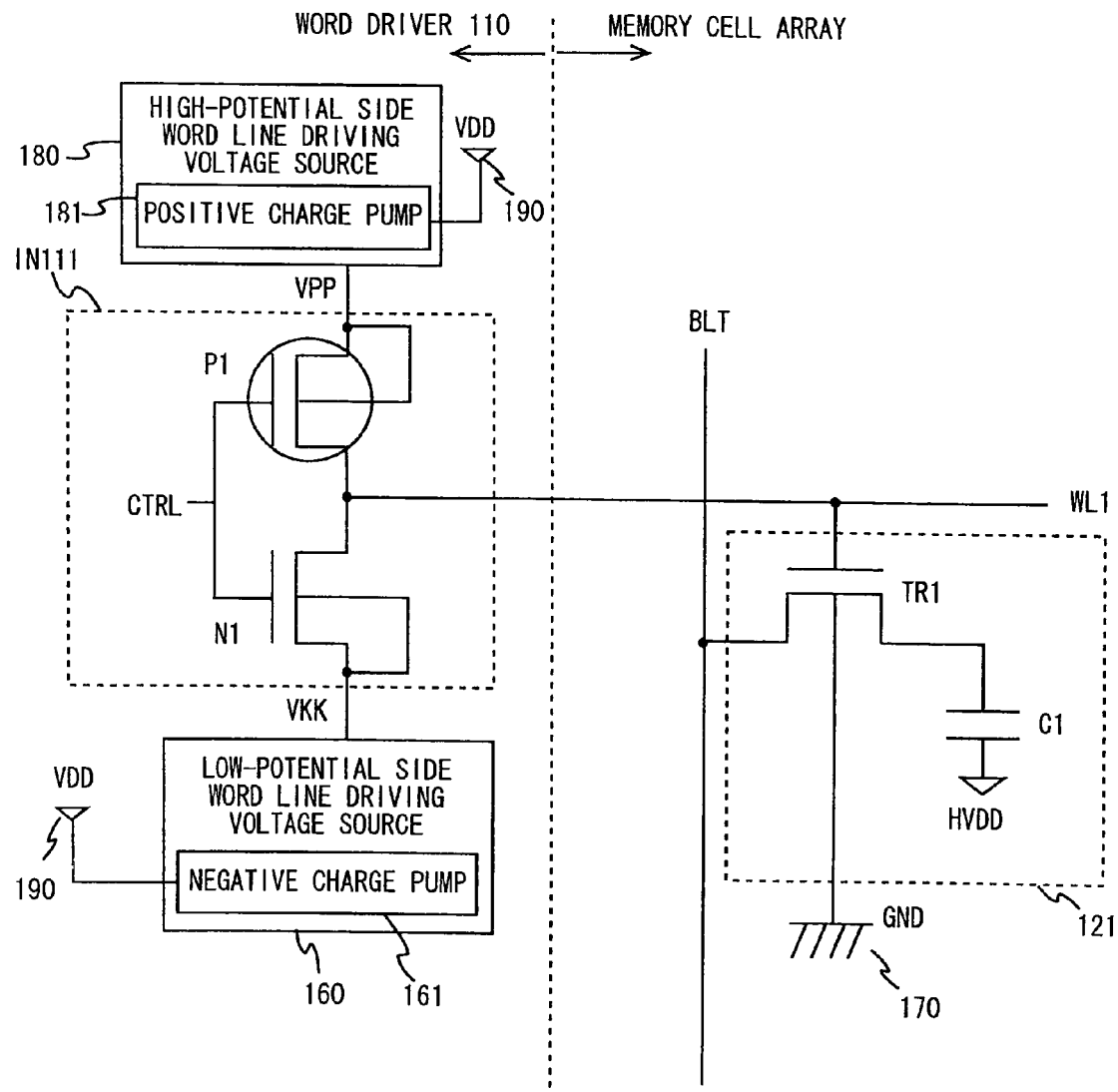
FIG. 2 shows one example of a simplified circuit configuration of the semiconductor storage device according to the embodiment.

The specific embodiment to which the present invention is applied will now be described in detail with reference to the drawings. FIG. 1 shows one example of a circuit configuration of a semiconductor storage device according to the present embodiment. FIG. 2 shows one example of a simplified circuit configuration of the semiconductor storage device shown in FIG. 1 and shows a configuration diagram focused only on a connection relation between an inverter of a word driver and a memory cell. Note that the present embodiment is the one in which the present invention is applied to a DRAM 100.

As shown in FIG. 1, the DRAM 100 includes a word decoder 110, a cell array 120, a ground terminal 170 outputting a ground voltage GND, and a power supply voltage terminal 190 outputting a power supply voltage VDD. The word decoder 110 includes a word driver 111, a high-potential side word line driving voltage source 180 outputting a positive voltage VPP, and a low-potential side word line driving voltage source 160 outputting a negative voltage VKK.

The word driver 111 includes inverters In111, In112, and In113. Each of the inverters In111, In112, and In113 outputs VPP or VKK as a word select signal or a word non-select signal to word lines WL1, WL2, and WL3. Further, as shown in FIG. 2, the inverter In111 includes a PMOS transistor P1 and an NMOS transistor N1 connected in series between the high-potential side word line driving voltage source 180 (output voltage is positive voltage VPP) and the low-potential side word line driving voltage source 160 (output voltage is negative voltage VKK). A control signal CTRL is input to gates of the PMOS transistor P1 and the NMOS transistor N1. Further, drains of the PMOS transistor P1 and the NMOS transistor N1 are connected together in a common node, and the word line WL1 is connected to this node.

For example, when information is written to/read out from the memory cell according to the control signal CTRL, the inverter In111 of the word driver 111 in FIG. 2 applies VPP to the word line WL1 as the word select signal. On the other hand, in holding the information, the inverter In111 of the word driver 111 applies VKK to the word line WL1. Therefore, amplitude of the voltage applied to the gate of the gate transistor of the memory cell described later corresponds to a voltage difference between VPP and VKK. This voltage difference is larger than a difference between the power supply voltage VDD and the ground voltage GND. Although FIG. 2 only shows a relation between the inverter In111 and the memory cell 121, the relation between the inverter In112 and the memory cell 122, and the relation between the inverter In113 and the memory cell 123 are the same as well. It should be noted that the memory cell 122 is connected to a bit line BLB.

The cell array 120 includes memory cells 121, 122, and 123. Each of the memory cells 121, 122, and 123 is connected to each of the word lines WL1, WL2, and WL3, respectively, and is connected to a complementary bit line pair BLT (True) and BLB (Bar). The memory cells 121, 122, and 123 include gate transistors Tr1, Tr2, and Tr3 formed by NMOS transistors and capacitors C1, C2, and C3, respectively. The gate transistor Tr1 of the memory cell 121 has a gate connected to the word line WL1, one of a drain and a source connected to the bit line BLT, and the other of the drain and the source connected to a reference voltage HVDD (VDD/2) through the capacitor C1. The gate transistor Tr2 of the memory cell 122 has a gate connected to the word line WL2, one of a drain and a source connected to the reference voltage HVDD (VDD/2) through the capacitor C2, and the other of the drain and the source connected to the bit line BLB. The gate transistor Tr3 of the memory cell 123 has a gate connected to the word line WL3, one of a drain and a source connected to the bit line BLT, and the other of the drain and the source connected to the reference voltage HVDD (VDD/2) through the capacitor C3. Each memory cell sets the gate transistor to a conduction state based on the voltage of each word line so as to read out information from/write information in the bit line BLT or BLB. Further, each memory cell sets the gate transistor to a non-conduction state so as to hold charge stored in the capacitor. The back gates of the gate transistors Tr1, Tr2, and Tr3 are connected to a common ground terminal 170.

The ground terminal 170 is a terminal connected to a package or the like of the device including the DRAM 100 of the present embodiment, and is a reference potential point (ground voltage GND) of a circuit forming the DRAM 100. More preferably, the ground terminal 170 is adjusted so as to output voltage of 0V as the reference potential point. The ground terminal 170 needs to be designed to have substantially low impedance in order to operate the circuit in a stable state.

The ground terminal 170 is connected to the back gates of the gate transistors Tr1, Tr2, and Tr3, as stated above. Typically, when the DRAM is configured by a multi-layer substrate, one layer is formed by a mesh type wire having substantially the same size as that of the DRAM chip, and this mesh type wire is employed as the wire from the back gate of each transistor to the ground terminal 170. Accordingly, the total capacity of the wire from the back gate of each transistor to the ground terminal 170 is significantly large. Hence, even if some noises are added to the reference potential point (ground voltage GND), this wiring capacity functions in the same way as the stabilizing capacitor; therefore there is little influence caused by the noise. Accordingly, the voltage of the back gates of the gate transistors Tr1, Tr2, and Tr3 is kept to the reference potential of 0V.

The sense amplifier 130 is connected to the complementary bit lines BLT and BLB. The sense amplifier 130 amplifies the potential difference of the complementary bit lines BLT and BLB according to the sense amplifier control signal SE and outputs the amplified potential difference.

An equalizer 140 is connected to the complementary bit lines BLT and BLB and sets the voltage of the complementary bit lines BLT and BLB to HVDD (VDD/2) as an example according to an equalizer control signal PDL.

A column selector 150 connects the complementary bit lines BLT and BLB and a common bit lines (not shown) according to a column select signal Y. The column selector 150 transmits information of the complementary bit lines BLT and BLB amplified by the sense amplifier 130 to the common bit lines, or transmits the information of the common bit lines to the complementary bit lines BLT and BLB.

The low-potential side word line driving voltage source 160 supplies the negative voltage VKK (second voltage in a broad sense) which is lower than the ground voltage GND to the word driver 111. The low-potential side word line driving voltage source 160 includes a negative charge pump 161, which generates the negative voltage VKK which is lower than the ground voltage GND. The negative charge pump 161 is connected to the power supply voltage terminal 190 and depresses the voltage using the power supply voltage VDD so as to generate the negative voltage VKK. The VKK is output from the inverter In111 of the word driver 111 to the word line WL1 when the information of the memory cell 121 is held, for example. The VKK voltage which is lower than the ground voltage GND is applied to the word line corresponding to the non-selected memory cell. This is because it is possible to prevent the charge held in the capacitor from being flowed out due to the off-state leak current of the gate transistor along with the miniaturization of the manufacturing process by applying negative voltage to the gate.

The high-potential side word line driving voltage source 180 supplies the positive voltage VPP (first voltage in a broad sense) which is higher than the power supply voltage VDD to the word driver 111. The high-potential side word line driving voltage source 180 includes a positive charge pump 181, which generates the positive voltage VPP which is higher than the power supply voltage VDD. The positive charge pump 181 is connected to the power supply voltage terminal 190 and boosts the voltage using the power supply voltage VDD so as to generate the positive voltage VPP. The positive voltage VPP is output from the inverter In111 of the word driver 111 to the word line WL1 when the information of the memory cell 121 is output, for example. The VPP voltage which is higher than the power supply voltage VDD is applied to the word line corresponding to the select memory cell. This is because it is possible to completely open the gate of the gate transistor Tr1 to reliably transmit the information held by the capacitor C1 to the bit line BLT.

In the present embodiment, the memory cells are arranged in three lines in a row direction and one line in a column direction for the sake of simplicity. However, it is also possible to increase the number of memory cells in the column direction and the row direction so that the memory cells are arranged in matrix form. In this case, the number of column selectors selecting the plurality of memory cells in each column unit, the number of inverters corresponding to the word lines selecting the plurality of memory cells in each row unit, and the number of sense amplifiers and equalizers corresponding to the complementary bit line pair transmitting the information of each memory cell are needed to be increased in accordance with the number of memory cells.

Figure 3:
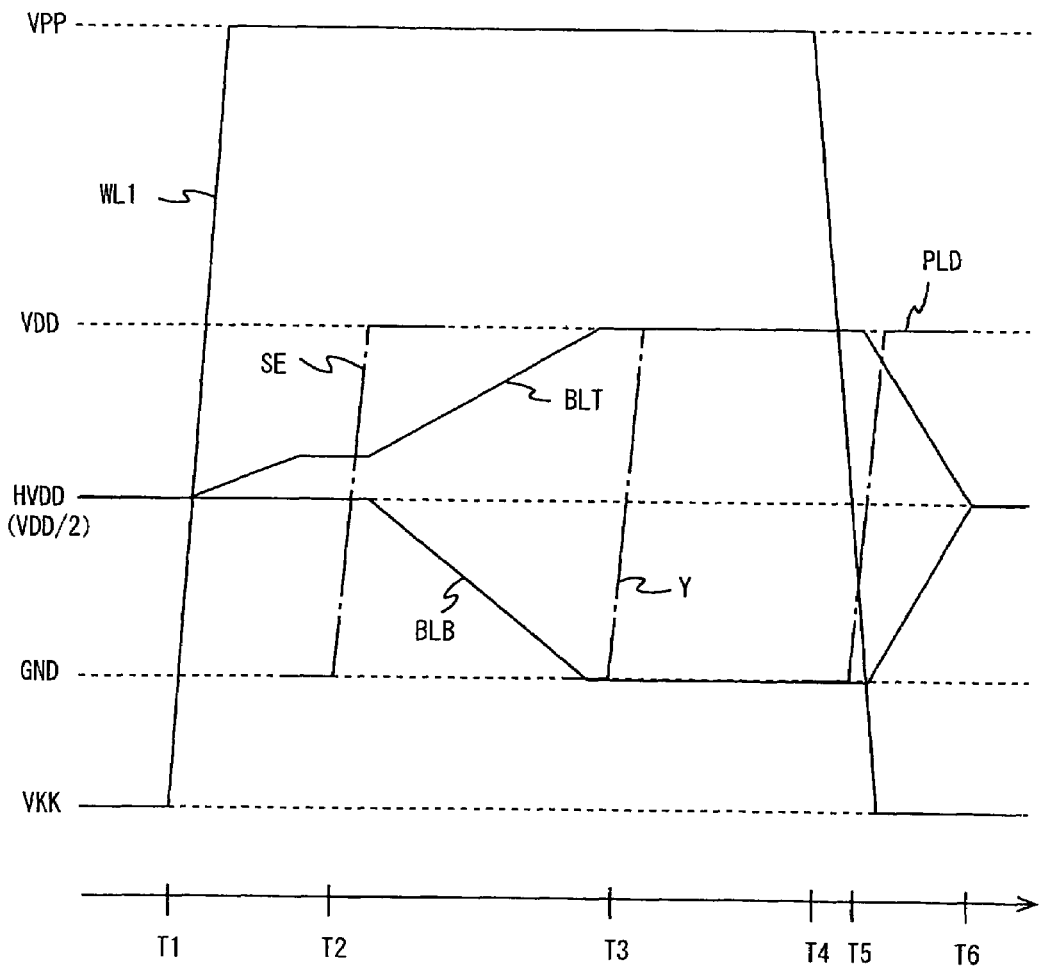
FIG. 3 shows one example of a timing chart of an operation of the semiconductor storage device according to the embodiment.

FIG. 3 shows a timing chart showing an operation of the DRAM 100 of FIG. 1. The description will be made on a case in which the H level information is stored in the memory cell 121 (charge is stored in the capacitor C1) and the held information is read out.

Before the time t1, the negative voltage VKK is applied from the inverter In111 of the word driver 111 to the word line WL1 as the word select signal. Therefore, the gate transistor Tr1 of the memory cell 121 is turned off so that the capacitor C1 and the word line WL1 are disconnected. The voltage of the complementary bit line pair BLT and BLB is charged to HVDD (VDD/2) by the equalizer 140 in advance.

At the time t1, the word select signal is raised to the H level according to the control signal CTRL input to the inverter In111. In summary, the voltage applied from the inverter In111 to the word line WL1 is VPP. Therefore, the gate transistor Tr1 of the memory cell 121 is turned on and the capacitor C1 and the word line WL1 are connected together. Accordingly, the charge held by the capacitor C1 is released to the bit line BLT (True) and the potential of the bit line BLT is raised from the reference voltage HVDD (VDD/2).

Next, at the time t2, the sense amplifier control signal SE is raised so as to operate the sense amplifier 130. Accordingly, the potential difference between the complementary bit lines BLT and BLB is amplified.

At the time t3, the column select signal Y is raised and is input to the column selector 150. Then the gate transistor of the column selector is turned on so as to connect the complementary bit line pair BLT, BLB with the common bit line pair. Therefore, the information of the complementary bit line pair BLT and BLB is output to the common bit line pair.

Next, at the time t4, the word select signal is fallen to the L level according to the control signal CTRL input to the inverter In111. Accordingly, the voltage applied from the inverter In111 to the word line WL1 is again VKK. Accordingly, the gate transistor Tr1 of the memory cell 121 is turned off again so as to disconnect the capacitor C1 and the word line WL1. The charge of the capacitor C1 has already been recharged. At the same time, the sense amplifier control signal SE and the column select signal Y are fallen and the sense amplifier 130 and the column selector 150 stop the operation.

At the time t5, the equalizer control signal PDL is raised and the equalizer 140 starts the operation. The voltage of the complementary bit line pair BLT and BLB is again charged to HVDD (VDD/2) by the equalizer 140.

After the time t6, the state is the same as that before the time t1, and the reading operation is completed. The above description has been made on a case of reading out the information held in the memory cell 121. The similar operation is performed in other memory cells as well.

As will be clear from the above operation, the gate transistor of the memory cell is turned on or off when the information held in the memory cell is read out or when the information is written in the memory cell, and the potential of each word line frequently repeats the H level (positive voltage VPP) and the L level (negative voltage VKK). This means that the operation of charging and discharging each word line is repeated. Therefore, the ability of the low-potential side word line driving voltage source 160 formed by the negative charge pump or the like needs to be enhanced as described in the related art. Otherwise the noise due to the charging and discharging of the word line may influence on the back gate side of the gate transistor due to the cross talk caused by the gate capacitor of the gate transistor of the memory cell functioning as the parasitic capacity.

Figure 4:
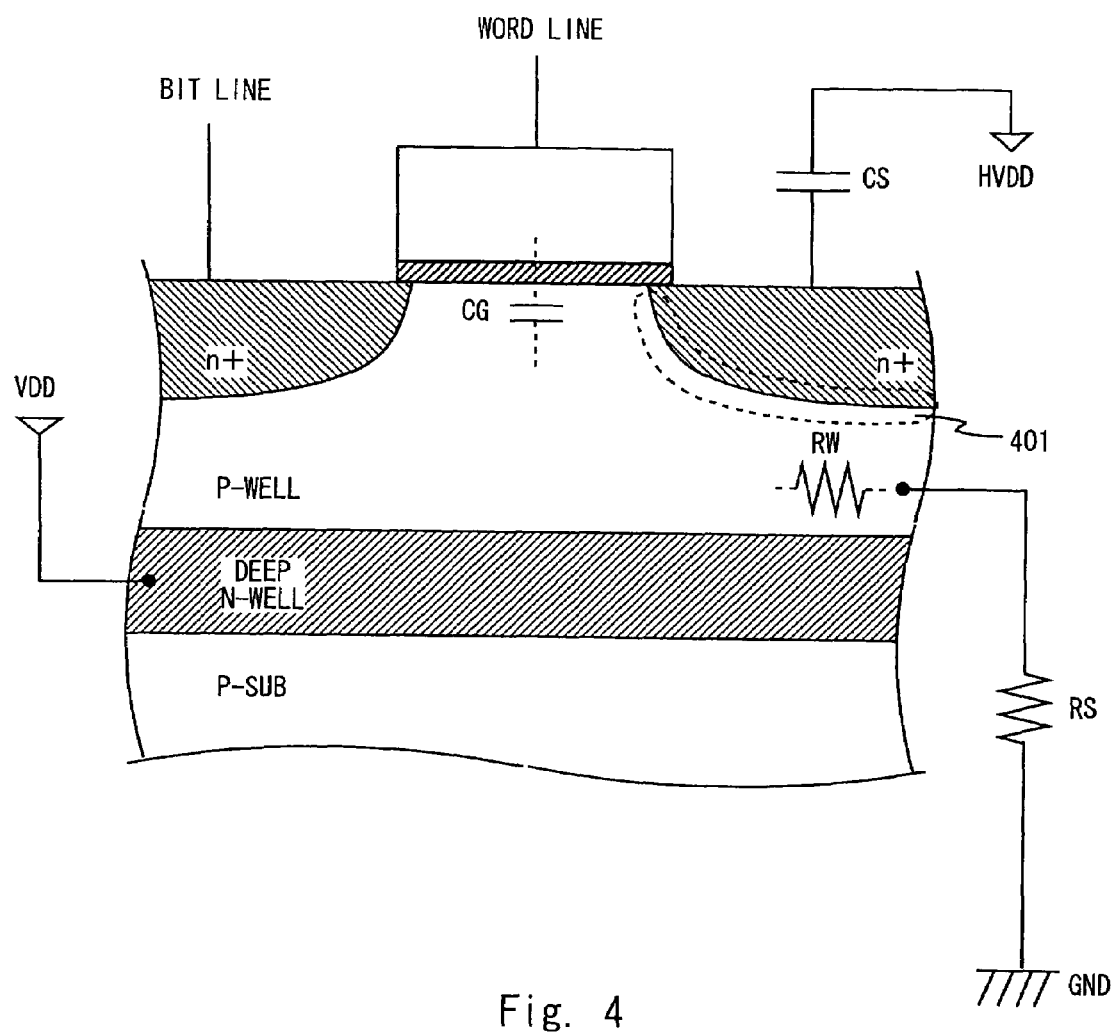
FIG. 4 shows one example of a configuration of a gate transistor of the semiconductor storage device according to the embodiment.

Now, FIG. 4 shows one example of a schematic diagram of a configuration of the gate transistor Tr1 of the memory cell 121 of FIG. 1 according to the present embodiment, for example. As shown in FIG. 4, a P well (back gate) of the gate transistor is connected to the ground terminal 170 (ground voltage GND). Cg in the drawing indicates a gate capacitor of a gate transistor, Cs indicates a capacitor of a memory cell, Rw indicates a well resistor, and Rs indicates a wiring resistor.

Figure 6:
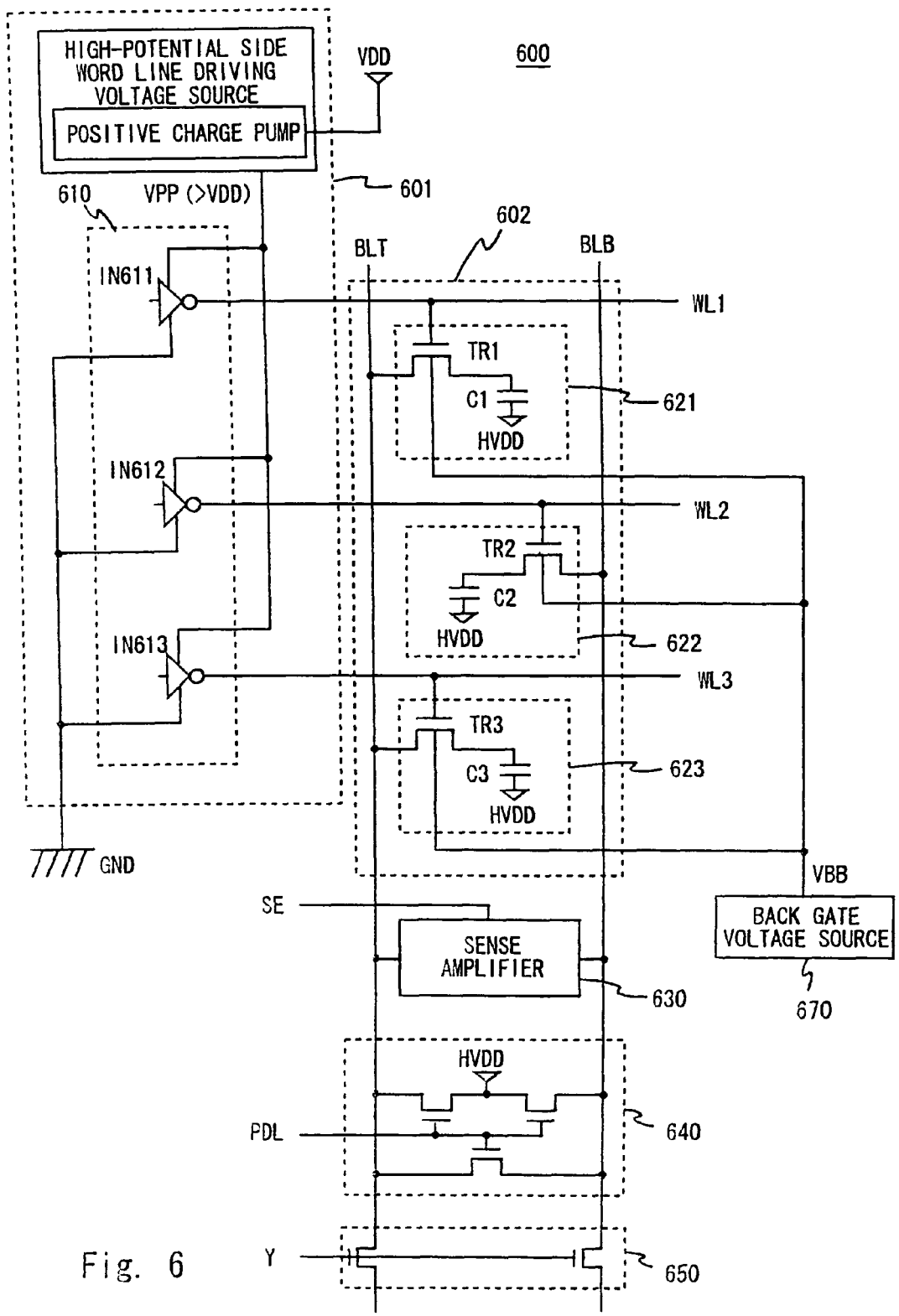
FIG. 6 shows one example of a circuit configuration of a semiconductor storage device according to a related art.
Figure 7:
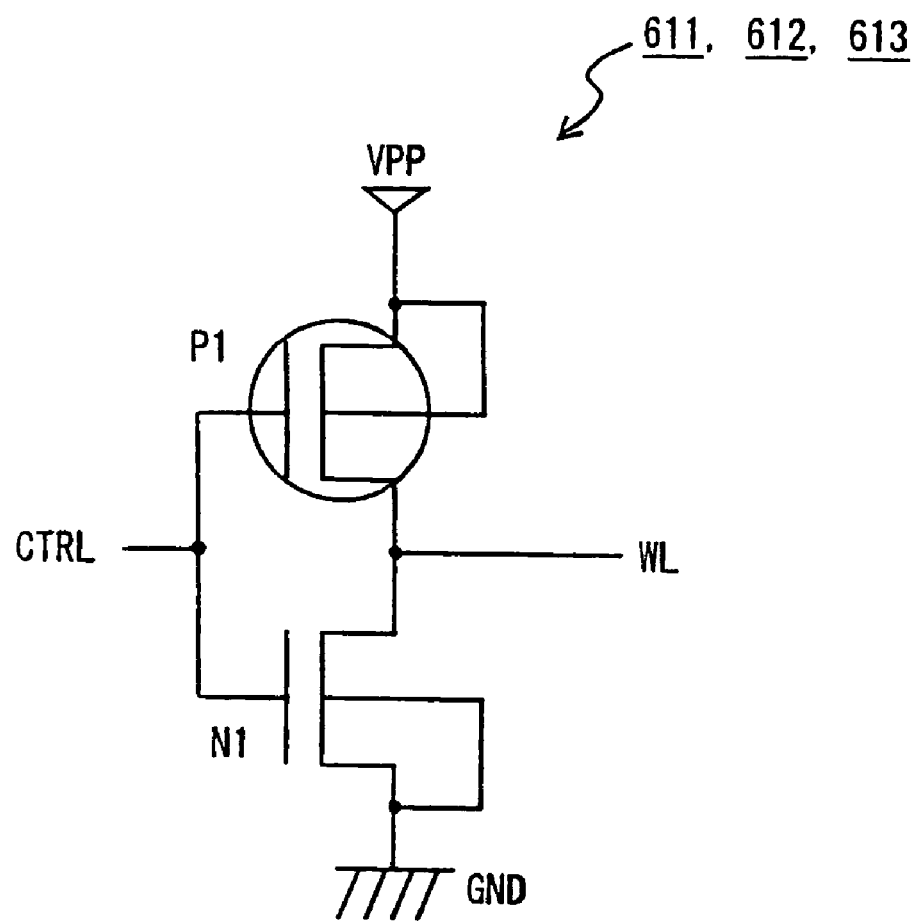
FIG. 7 shows one example of a circuit configuration of an inverter of the semiconductor storage device according to the related art.
Figure 8:
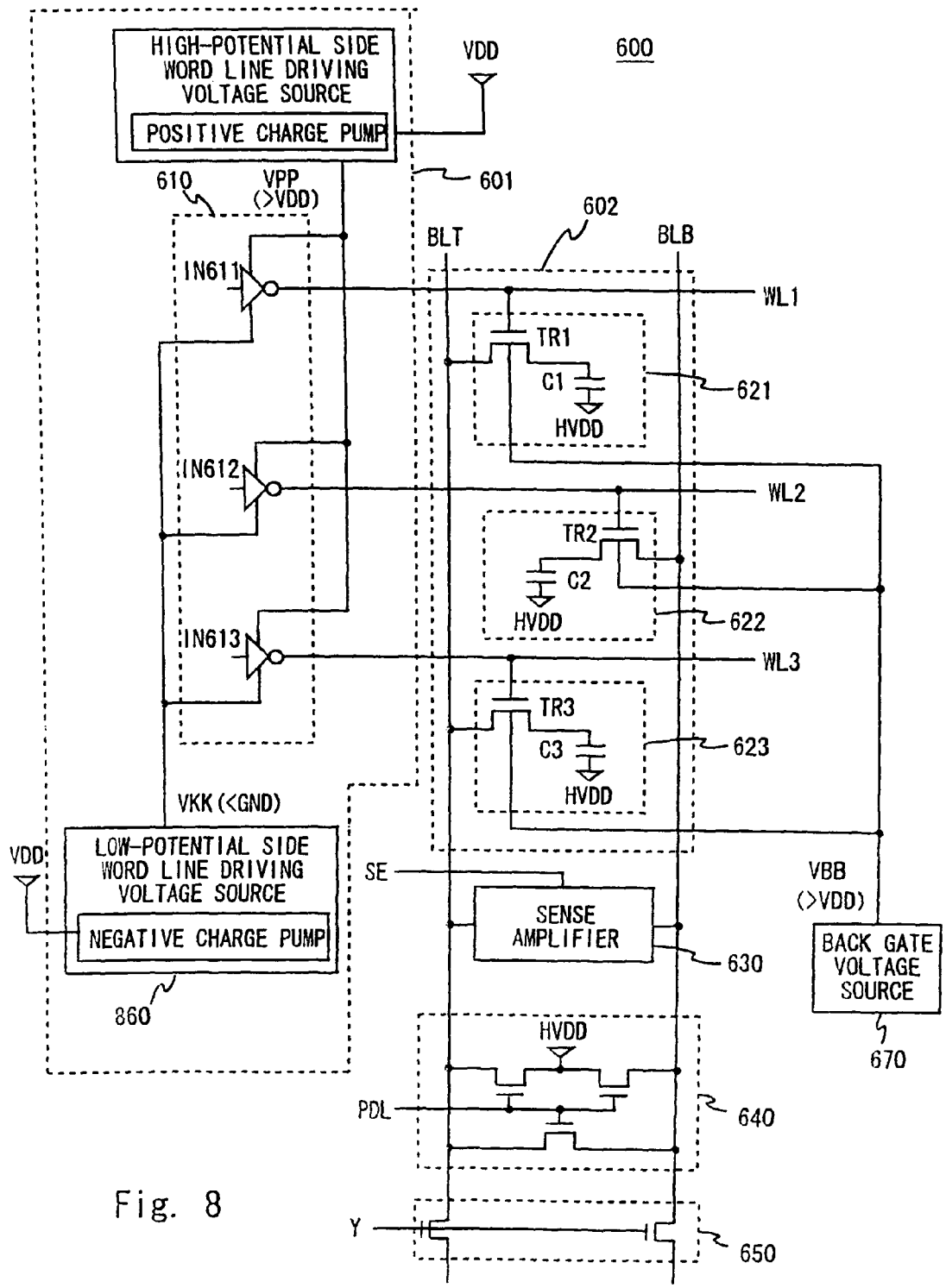
FIG. 8 shows another example of a circuit configuration of the semiconductor storage device according to the related art.
Figure 9:
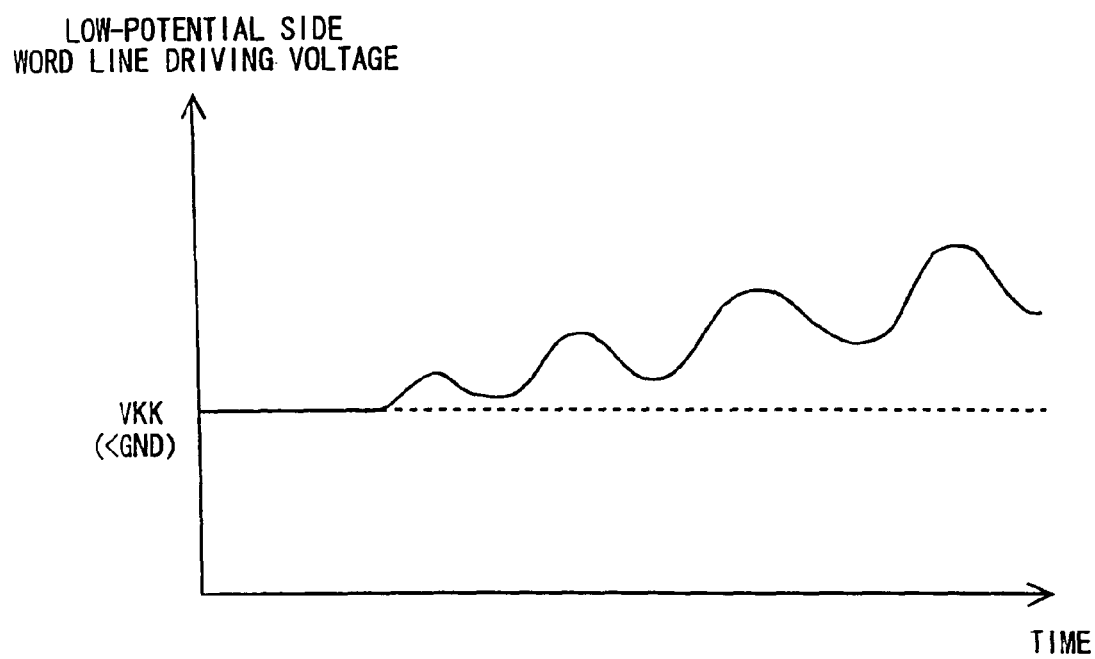
FIG. 9 shows one example of output properties of a low-potential side word line driving voltage source of the semiconductor storage device according to the related art.
Figure 10:
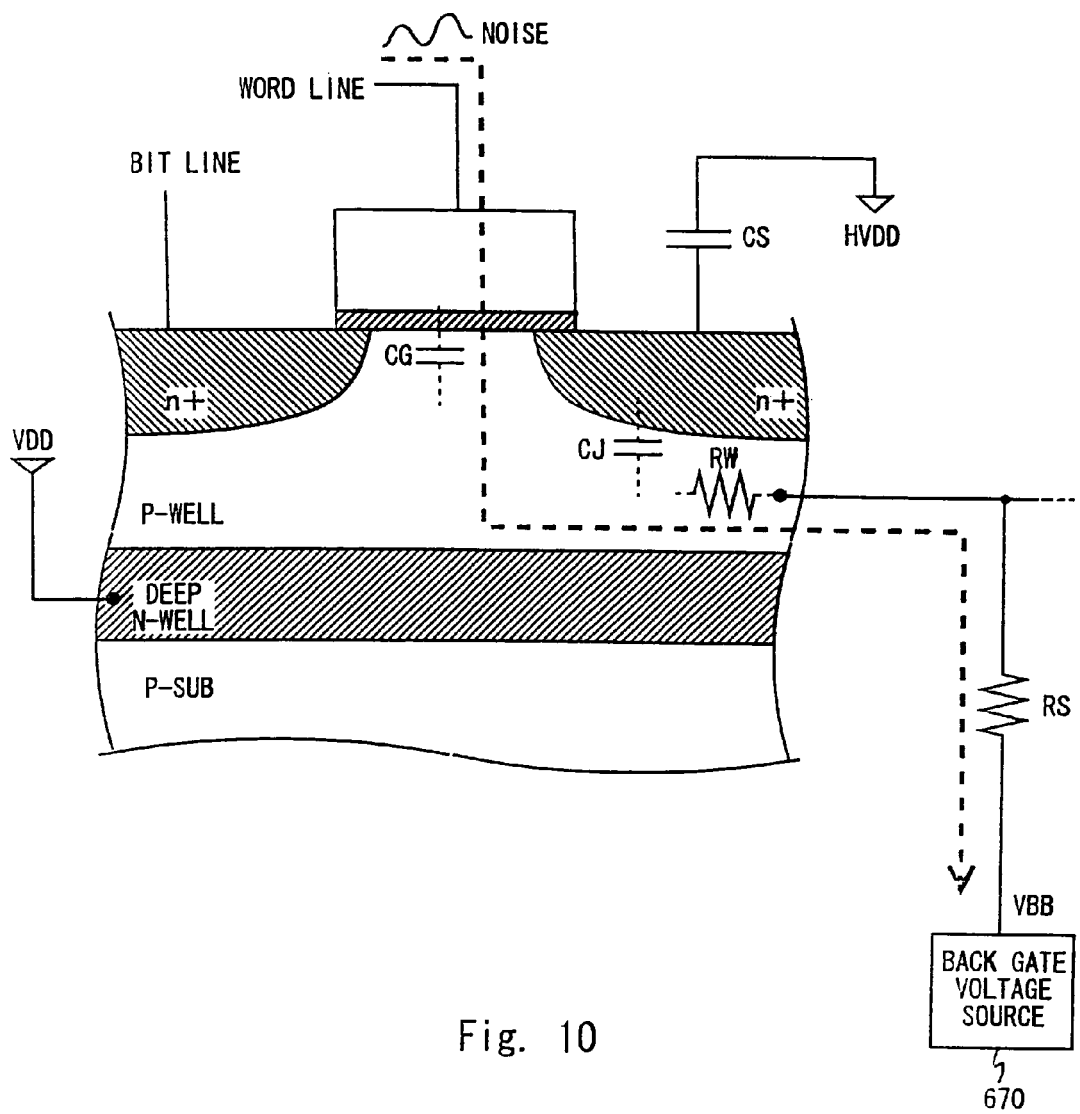
FIG. 10 shows one example of a configuration of a gate transistor of the semiconductor storage device according to the related art.

As stated above, when the back gate of the gate transistor is connected to the ground terminal 170 (ground voltage GND), the status can be the same as in the case of extremely enhancing the voltage output capability when the output voltage of the back gate voltage source 670 in the related art shown in FIG. 6 is set to the ground voltage GND, for example. Note that the voltage output capability here means the ability of supplying a predetermined voltage to the circuit which is a load or the like. Accordingly, in this case, a gate capacitor Cg having one end connected to the ground terminal 170 functions as a stabilizing capacitor against the noise of the low-potential side word line driving voltage source 160. As stated above, in the related art, the gate capacitor Cg functions as the parasitic capacity which causes crosstalk to the back gate voltage source 670 by the noise. However, in the present embodiment, totally different result is obtained. Further, the total amount of the stabilizing capacitor includes all the gate capacitors Cg of the gate transistors of the non-selected memory cells in the DRAM. Hence, as the number of memory cells is large, the capacity becomes sufficiently large with respect to the noise.

Accordingly, in the present embodiment, the back gate of the gate transistor of the memory cell is connected to the ground terminal 170 so as to make it possible to eliminate the influence of the noise on the low-potential side word line driving voltage source 160. Further, since there is no need to provide a back gate voltage source 670 and a stabilizing capacitor unlike the related art, it is possible to reduce the DRAM chip area. Further, since the current of the power supply circuit of the back gate voltage source 670 is not needed, the stand-by current of the DRAM can be reduced.

In the present embodiment, the voltage applied to the back gate of the gate transistor of the memory cell is powered up to the ground voltage in place of the negative voltage, which may cause a problem. However, the bias VBB itself of the back gate tends to be decreased due to a problem such as a withstand voltage along with the recent highly accurate manufacturing technique or miniaturization of the manufacturing process. For example, the bias VBB is about −0.3 V. Accordingly, even when the bias of the back gate is somewhat increased, there is little probability of causing a problem with respect to the effect of suppressing the individual difference of the transistor threshold value due to the process variation as described in the related art. Further, it is desirable to employ the ground voltage rather than the negative voltage as VBB for the purpose of decreasing withstand voltage load of a junction of an n region to which the capacitor is connected and a p region forming the well shown in a region 401 in FIG. 4.

Now, FIG. 5 shows a simple table showing a technical transition of the related art. The related art (1) has been employed for a long time. This technique is not sufficiently miniaturized. The potential of the word line of the non-selected memory cell is the ground voltage GND, and the negative voltage VBB is applied as the bias of the back gate of the gate transistor of the memory cell. In the related art (2), the manufacturing process is equal to or less than about 90 nm, and the negative voltage VKK is applied to the potential of the word line of the non-selected memory cell and the negative voltage VBB is applied as the bias of the back gate as is the same as the related art (1) in order to reduce the leak current of the gate transistor. However, in the related art (2), the magnitude of the VBB is smaller than that of the related art (1). In the present invention, the negative voltage VKK is applied to the potential of the word line of the non-selected memory cell and the bias of the back gate is set to the ground voltage GND. The effect realized by setting the bias of the back gate to the ground voltage has already been described above.

Based on the background of the related art, it is widely appreciated that the negative voltage is applied as the bias of the back gate. Then the potential of the word line of the non-selected memory cell is set to the negative voltage VKK in order to correspond to the miniaturization of the manufacturing process, which causes the noise problem as described above. The DRAM according to the embodiment of the present invention connects the back gate of the gate transistor to the ground power source, which makes it possible to solve the problem of the noise which is described above. Further, there is caused no problem even when the back gate is changed from the negative voltage to the ground voltage. Accordingly, the embodiment of the present invention is highly effective in forming the DRAM.

Note that the present invention is not limited to the above embodiment but can be changed as appropriate within the scope of the present invention. For example, the NMOS transistor forming the gate transistor of the memory cell can be changed to the PMOS transistor. In this case, it should be noted that the relative relation of the voltage is substantially contrary to the case where the NMOS transistor is employed. For example, the voltage applied to the selected word line becomes negative voltage VKK, the voltage applied to the non-selected word line becomes positive voltage VPP, and the voltage applied to the back gate becomes power supply voltage VDD. There is no change in the HVDD (VDD/2) connected to the capacitor of the memory cell.

The present invention can be applied to the semiconductor storage device outputting the negative voltage to the word line corresponding to the non-selected memory cell in the memory such as the SRAM.

Furthermore, the present embodiment has been described above having a configuration generating the voltage higher than VDD in the internal booster circuit. However, the present invention is not limited to this embodiment but it is also possible to input high voltage and VDD from an external part of the memory.

Although the precharge level of the bit line is set to HVDD or VDD/2 in the above embodiment, the voltage can be any value that is lower than HVDD for improving hold properties.

It is apparent that the present invention is not limited to the above embodiments, but may be modified and changed without departing from the scope and spirit of the invention.

What is claimed is:

1. A semiconductor storage device comprising a DRAM cell including one transistor and one capacitor, wherein one of a first voltage and a second voltage is applied to a gate of the transistor, the first voltage being a selected voltage, and the second voltage being a non-selected voltage,
a voltage difference between the first voltage and the second voltage is larger than a voltage difference between a power supply voltage and a ground voltage, and
one of the ground voltage and the power supply voltage which is closer to the non-selected voltage is applied to a back gate of the transistor irrespective of selection or non-selection.

2. The semiconductor storage device according to claim 1, wherein the transistor comprises an NMOS transistor.

3. The semiconductor storage device according to claim 2, wherein
the first voltage is a positive voltage which is higher than the power supply voltage, and
the second voltage is a negative voltage which is lower than the ground voltage.

4. The semiconductor storage device according to claim 1, wherein the transistor comprises a PMOS transistor.

5. The semiconductor storage device according to claim 4, wherein
the first voltage is a negative voltage which is lower than the ground voltage, and
the second voltage is a positive voltage which is higher than the power supply voltage.

6. The semiconductor storage device according to claim 3, wherein the positive voltage is boosted by a positive charge pump and the negative voltage is depressed by a negative charge pump.

7. The semiconductor storage device according to claim 1, wherein a potential of a node of two nodes included in the capacitor, the node being not connected to the transistor, is an intermediate potential between the power supply voltage and the ground voltage.

8. The semiconductor storage device according to claim 1, further comprising:
a plurality of word lines;
a word decoder supplying voltage to the word lines;
a plurality of bit lines;
cell transistors connected to the word lines and the bit lines; and
cell capacitors connected to the cell transistors, wherein
the word decoder decodes a selected word line and a non-selected word line in a first voltage difference which is larger than a voltage difference between a power supply voltage and a ground voltage, and
back gates of all the cell transistors are coupled to a power supply line supplying one of the ground voltage and the power supply voltage which is closer to the voltage of the non-selected word line.

9. The semiconductor storage device according to claim 8, wherein a first voltage and a second voltage are input to the word decoder to generate the first voltage difference, the first voltage being higher than the power supply voltage, and the second voltage being lower than the ground voltage.

10. The semiconductor storage device according to claim 9, further comprising a positive charge pump generating the first voltage.

11. The semiconductor storage device according to claim 9, further comprising a negative charge pump generating the second voltage.

12. The semiconductor storage device according to claim 1, further comprising:
a plurality of word lines;

a word decoder supplying a selected voltage and a non-selected voltage to the word lines;
a plurality of bit lines;
cell transistors connected to the word lines and the bit lines; and
cell capacitors connected to the cell transistors, wherein back gates of all the cell transistors are supplied with one of a ground voltage and a power supply voltage which is closer to the non-selected voltage so that non-selected cell transistor of the cell transistors has a stabilizing capacity stabilizing the non-selected voltage.

* * * * *